(12) United States Patent
Mann et al.

(10) Patent No.: US 7,688,578 B2
(45) Date of Patent: Mar. 30, 2010

(54) MODULAR HIGH-DENSITY COMPUTER SYSTEM

(75) Inventors: Ronald M. Mann, Cypress, TX (US); Gary S. Landrum, Houston, TX (US); Robert M. Hintz, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 18 days.

(21) Appl. No.: 11/880,342

(22) Filed: Jul. 19, 2007

(65) Prior Publication Data
US 2009/0021907 A1 Jan. 22, 2009

(51) Int. Cl.
*H05K 7/20* (2006.01)

(52) U.S. Cl. .................. 361/679.46; 361/688; 361/690; 361/716; 361/725; 361/727; 454/184

(58) Field of Classification Search ......... 361/687–695, 361/716, 724, 727; 454/184
See application file for complete search history.

(56) References Cited

U.S. PATENT DOCUMENTS

| | | | | |
|---|---|---|---|---|
| 3,949,277 | A * | 4/1976 | Yosset | 361/686 |
| 5,216,579 | A * | 6/1993 | Basara et al. | 361/679.46 |
| 5,761,032 | A * | 6/1998 | Jones | 361/685 |
| 6,018,456 | A * | 1/2000 | Young et al. | 361/684 |
| 6,175,490 | B1 * | 1/2001 | Papa et al. | 361/686 |
| 6,272,573 | B1 * | 8/2001 | Coale et al. | 710/100 |
| 6,324,062 | B1 * | 11/2001 | Treiber et al. | 361/727 |
| 6,331,933 | B1 * | 12/2001 | Rumney | 361/679 |
| 6,833,996 | B2 * | 12/2004 | Haworth | 361/730 |
| 6,836,030 | B2 * | 12/2004 | Smith et al. | 307/147 |
| 6,882,530 | B2 * | 4/2005 | Cyphers et al. | 361/829 |
| 6,970,348 | B2 * | 11/2005 | Treiber et al. | 361/683 |
| 7,173,821 | B2 * | 2/2007 | Coglitore | 361/695 |

FOREIGN PATENT DOCUMENTS

| | | |
|---|---|---|
| JP | 05-191072 A | 7/1993 |
| JP | 09-116283 A | 5/1997 |
| JP | 09-260860 A | 10/1997 |
| JP | 2000-349469 A | 12/2000 |
| JP | 2002-032153 A | 1/2002 |
| JP | 2003-273532 A | 9/2003 |

OTHER PUBLICATIONS

"Notification of Transmittal of the International Search Report and the Written Opinion of the International Searching Authority or the Declaration, Written Opinion of the International Searching Authority and International Search Report" dated Jan. 6, 2009, from counterpart PCT Application No. US2008/006581 (4 pages).

(Continued)

*Primary Examiner*—Boris L Chervinsky

(57) ABSTRACT

A modular high-density computer system has an infrastructure that includes a framework component forming a plurality of bays and has one or more cooling components. The computer system also has one or more computational components that include a rack assembly and a plurality of servers installed in the rack assembly. Each of the one or more computational components is assembled and shipped to an installation site separately from the infrastructure and then installed within one of the plurality of bays after the infrastructure is installed at the site.

14 Claims, 3 Drawing Sheets

OTHER PUBLICATIONS

Written Opinion of the International Searching Authority, dated Jan. 6, 2009, from counterpart PCT Application No. US2008/006581 (4 pages).
International Search Report, dated Jan. 6, 2009, from counterpart PCT Application No. US2008/006581 (3 pages).
English Translation of Portion of JP 2003-273532 A.
English Translation of Portion of JP 2002-032153 A.
English Translation of Portion of JP 2000-349469 A.
English Translation of Portion of JP 09-260860 A.
English Translation of Portion of JP 05-191072 A.
English Translation of Portion of JP 09-116283 A.

* cited by examiner

MODULAR HIGH-DENSITY COMPUTER SYSTEM

BACKGROUND

As enterprise applications continue to increase in complexity, a commensurate increase in computational power is required to perform those applications. Because data centers continuously strive to achieve efficiencies in floor space, in power and data distribution, and in system management in the face of the ever increasing number of servers deployed, a trend has emerged toward greater densification in the manner in which those servers are physically configured. For example, servers are currently available with multiple processors in very low profile configurations that can be deployed in rack structures. One example is the Proliant®[1] DL360 G4 server available from Hewlett Packard Company, which has a height of one rack unit and employs two processors. Thus a single 42 U (unit) rack can contain as many as 42 such servers. An even denser configuration can be achieved using a 1/2U Proliant® BL p-Class blade server from Hewlett Packard Company, of which up to 96 such blade servers can populate a 42 U rack.

[1]Proliant is a trademark of the Hewlett Packard Company.

With increased density in processing power also comes a commensurate increase in the amount and density of power dissipated by the computational components in the form of heat. One of the challenges faced by data centers deploying these densely configured servers is how to provide sufficient cooling to these densely populated racks. Without sufficient cooling, the servers and particularly their components are prone to reduced performance, shorter life and outright failure, which can lead to higher costs and even catastrophic results for the data center.

Historically, a room oriented cooling infrastructure was sufficient to handle this cooling problem. Such an infrastructure was typically made up of one or more bulk air conditioning units designed to cool the room to some average temperature. This type of cooling infrastructure evolved based on the assumption that the computer equipment is relatively homogenous and that the power density is on the order 1-2 Kilowatts per rack. The high density racks mentioned above, however, can be on the order of 20 Kilowatts per rack and above. This increase in power density, and the fact that the equipment can be quite heterogeneous leads to the creation of hotspots that can no longer be sufficiently cooled with simple room-oriented cooling systems.

This increase in local power density has led to the development of numerous localized cooling components that can be deployed more proximately to the racks containing the computational components themselves. These infrastructure components include cooling units that employ fans and heat exchangers that can be distributed locally within rows of racks to meet the specific cooling requirements of the computational components within the rows. Cooling components have also been integrated within individual rack assemblies. These newer cooling components allow data centers to build a cooling infrastructure that is locally distributed throughout the computational components, and which is tailored to the specific computational components deployed by the data center. Given the often heterogeneous nature of a data center's computational components, its overall cooling infrastructure may consist of a combination of room-oriented, row oriented and/or rack-centric cooling components.

A further trend that has emerged from the densification of computer components is that data centers have begun seeking fully assembled and tested computational system components as lieu of purchasing individual servers, assembling them into racks on site, loading the operating system software, and bringing the system up to an operational condition. They may even seek to have their own application software installed and fully tested on the system before taking delivery. Additionally, today's data centers are seeking to have the requisite cooling infrastructure provided with its purchase of computational component(s). In-row and rack-oriented cooling components developed for high density racks, such as those that employ heat exchangers using water or refrigerants, constitute a complex and bulky infrastructure that is added to the computational component to be cooled.

This cooling infrastructure, combined with an already heavy rack of computational components creates a very large, very cumbersome integrated system that presents an enormous challenge to ship to the data centers and then to install them. Data center hallways, doors and isles are simply not typically designed to facilitate their delivery and installation in this newly desired level of integration. Moreover, high-density computational components present significant challenges at the time of installation in providing power and data distribution infrastructure as well. The sheer number of connections required to these dense configurations can create enormous amounts of cabling. Finally, because today the infrastructure is delivered fully integrated with the computational components, a considerable amount of time is still required to bring the systems up after delivery. Power lines, data lines, air duct and coolant lines must all still be interfaced to the infrastructure before the systems can be brought up to an operational level.

BRIEF DESCRIPTION OF THE DRAWINGS

For a detailed description of embodiments of the invention, reference will now be made to the accompanying drawings in which.

DETAILED DESCRIPTION

The following discussion is directed to various embodiments of the invention. Although one or more of these embodiments may be preferred, the embodiments disclosed should not be interpreted as, or otherwise be used to limit the scope of the disclosure, including the claims, unless otherwise expressly specified herein. In addition, one skilled in the art will understand that the following description has broad application, and the discussion of any particular embodiment is meant only to be exemplary of that embodiment, and not intended to raise an inference that the scope of the disclosure, including the claims, is limited to that embodiment.

Moreover, certain terms are used throughout the following description and in the claims to refer to particular features, apparatus, procedures, processes and actions resulting therefrom. Those skilled in the art may refer to an apparatus, procedure, process, result or a feature thereof by different names. This document does not intend to distinguish between components, procedures or results that differ in name but not function. In the following discussion and in the claims, the terms "including" and "comprising" are used in an open-ended fashion, and thus should be interpreted to mean "including, but not limited to . . . ."

Embodiments of the invention include modular computational components and infrastructure components to achieve numerous benefits over the current art. The computational components can be fully assembled and tested to specifications provided by the customer prior to shipment. The computational components and the requisite infrastructure components of the invention can be shipped separately to the customer to facilitate their safe and less costly transport and to make them easier as separate components to maneuver into place for installation at the customer's site upon delivery. The cooling and housing infrastructure components of the invention can be shipped to and installed at the customer's site while the computational components of the invention are being assembled and tested. Installation of the cooling and housing infrastructure components, as well as power and data distribution infrastructure components, is typically the most time and labor intensive aspect of the installation of a high-density computer system. Providing for pre-installation of the cooling, power and data distribution infrastructure components prevents delays in the commissioning of the computational components. The computational components of the invention are easily coupled to the cooling, power and data distribution infrastructure components of the invention to provide a very simple installation and a much shorter time to achieve full operation of the high density computer system.

Figure 1:
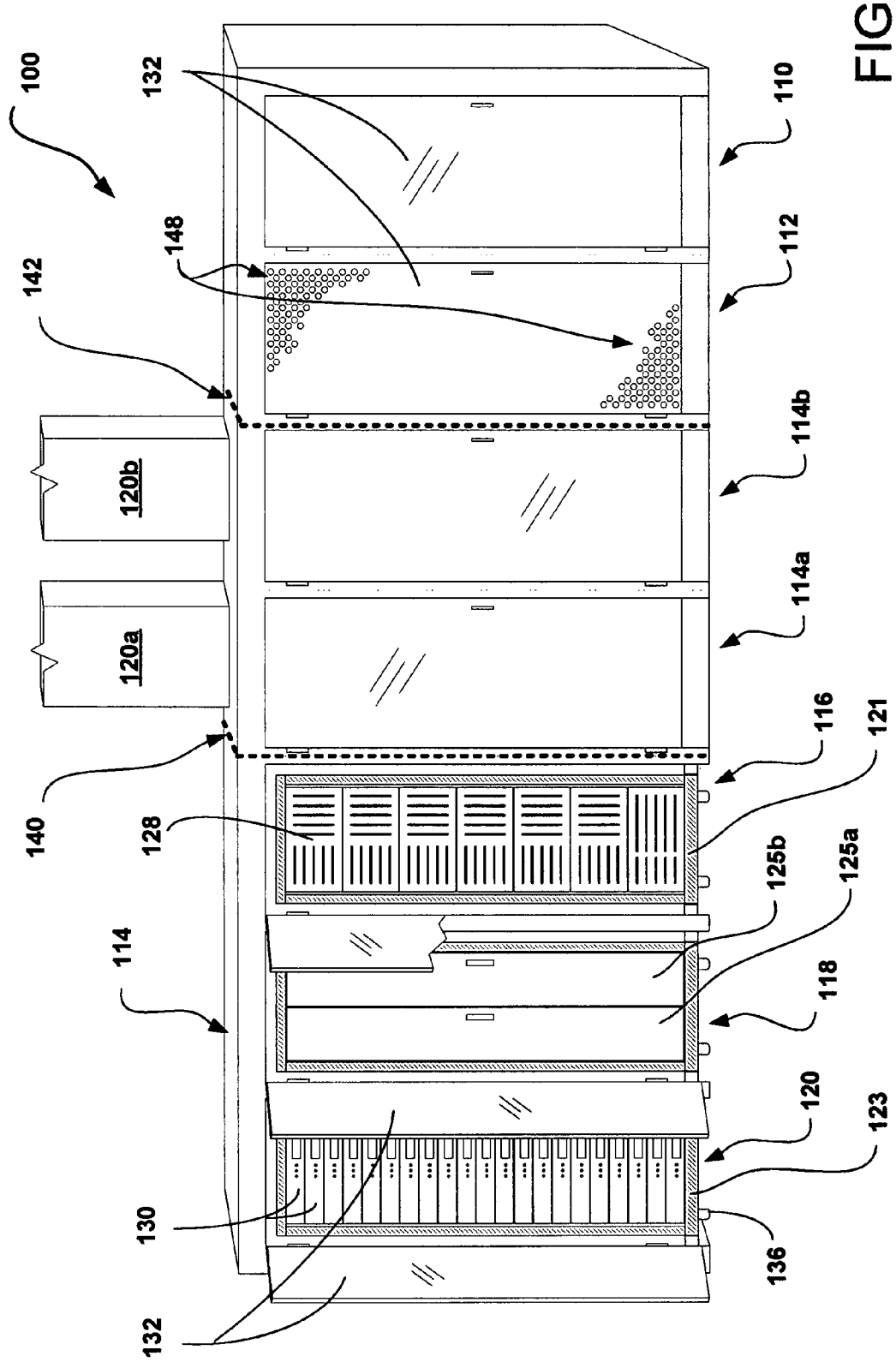
FIG. 1 is a front view illustration of a modular high density computer system as it might be installed in a data center in accordance with an embodiment of the invention.

FIG. 1 illustrates a modular high-density computer system 100 as it might be installed at a customer site such as a data center in accordance with an embodiment of the invention. The modular high-density computer system includes infrastructure components for housing, cooling and distributing power and data to computational components of the computer system. In an embodiment, the infrastructure components include a structural framework forming a row of bays 110, 112, 114a, 114b, 116 and 118. The bays are each configured to house either computational and/or infrastructure components and include doors 132 that are typically closed during normal operation.

For example, bay 110 can be used to house power distribution components (not shown) that distribute power to cooling and computational components housed in one or more of the other bays. Bay 112 can be used to house one or more relatively low power density computational components that can be sufficiently cooled through door perforations 148 using cold air generated by a standard room oriented cooling infrastructure (not shown). Bays 112a and 112b can provide in-row cooling for two medium power density computational components (not shown) through a forced-air cooling infrastructure that receives cold air from a plenum such as underneath the floor, the cold air from which passes up through the bottom of bays 112a and 112b, and which then exhausts as hot air through ceiling ducts 120a and 120b respectively. Bay 118 can be used to house heat exchange cooling components 125a, 125b to provide in-row cooling for high-power density computational components 123, 121 housed in bays 126 and 122 respectively. Those of skill in the art will appreciate that the infrastructure framework can be completely integrated or could be delivered as modular infrastructure framework components demarcated at lines 140 and 142.

In an embodiment, the computational components such as the high-density components 121 and 123 are assembled and delivered separately from the infrastructure components such as the framework that forms the bays 120 and 121 that house them. These computational components can include rack assemblies having slots for receiving the servers that make up the computational components. The slots provide structural support for the servers and a coupling to a back-plane which provides connectivity to power and data I/O (inputs and outputs). The high-density computational components can be made up of servers that are of a height, for example, of 1 or 2 rack units such as servers 130 of computational component 123. These servers can be, for example, the Proliant® DL360 G4 server available from Hewlett Packard Company. Another example of a high-density computational component could be a rack of blade servers 128 that make up computational component 121 of FIG. 1. These servers could be, for example, the Proliant® BL p-Class blade server available from Hewlett Packard Company. A more detailed description of an embodiment of a rack assembly of the computational component will be presented below.

Those of skill in the art will appreciate that cooling infrastructure components 125a and 125b, although considered part of the cooling infrastructure of the high-density computer system 100, can also be configured as modular assemblies that can be assembled and delivered separately from the infrastructure framework to facilitate shipping, delivery and installation, as can the power distribution infrastructure component (not shown) that resides in bay 110. It will also be appreciated that in an embodiment, the high-density computer system 100 can be of one homogenous type of cooling infrastructure component, as well as one type of computational component, rather than a heterogeneous mix of different cooling and computational components as illustrated in FIG. 1.

Figure 2:
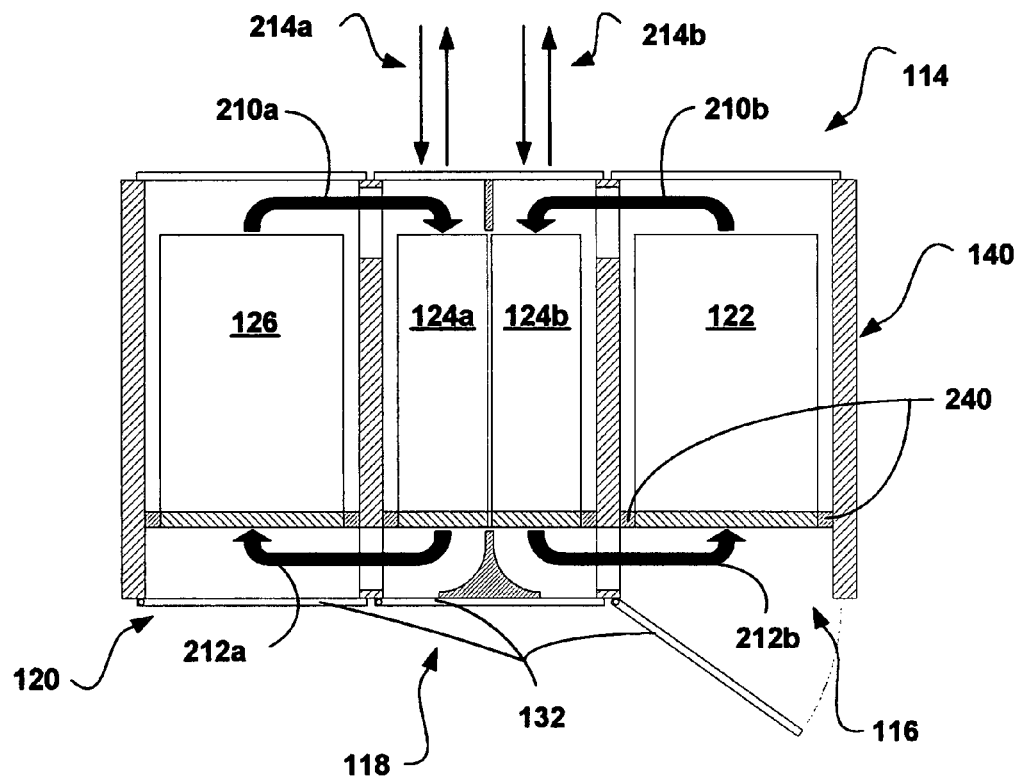
FIG. 2 is an open view illustration from above a modular cooling infrastructure component of the modular high density computer system of FIG. 1 in accordance with an embodiment of the invention.

FIG. 2 illustrates an open view from above the infrastructure framework and in particular of bays 116, 118 and 120. The cooling infrastructure components 124a and 124b residing in bay 118 typically include fans (not shown) that create a circular airflow pattern by sourcing cold air 212a and 212b at the front of bay 118 into bays 120 and 116 respectively. The fans also draw hot air 210a and 210b, as the cold air is heated by high-density computational components 126 and 122, from the back of bays 120 and 116 respectively into the back of bay 118 and back into cooling components 124a and 124b. The hot air is then cooled by a heat exchanger (not shown) that is supplied with a cooling agent such as cold water or a refrigerant as is known in the art. The cooling components 124a and 124b can be supplied with the cooling agent through circulating supply lines 214a and 214b coupled thereto through the back wall of the infrastructure framework forming bay 118.

As previously mentioned, the cooling components 124a and 124b can be provided as a modular assembly that can be wheeled into the bay 118 and then coupled to power and the cooling agent supply lines, or they can be assembled from the requisite components within a bay of the infrastructure framework once the infrastructure framework has been located within the installation site. Sealing structures 220 at the front of each bay 120, 118 and 116 prevent hot air from returning to the front of the bays and mixing with the cold air. Doors 132 are typically closed during operation to prevent cold air from escaping from the front of bays 120, 118 and 116.

Figure 3:
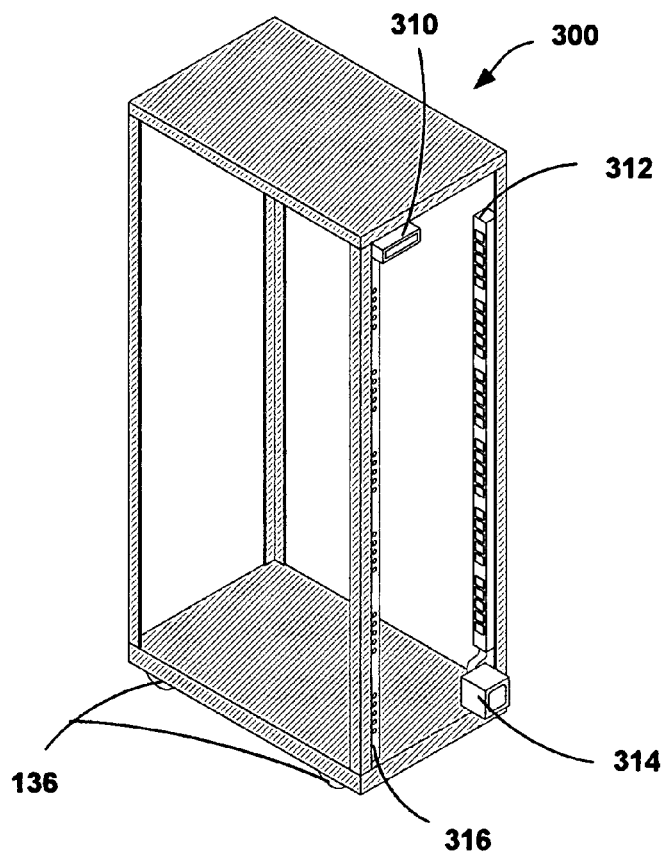
FIG. 3 is a rear perspective view of a modular rack assembly of the modular high density computer system of FIG. 1 in accordance with an embodiment of the invention.

FIG. 3 illustrates an embodiment of a computational component rack assembly 300 of the invention prior to installation of server components therein. The rack assembly 300 can include an AC power distribution strip 312 at the back of the rack assembly that provides conductive contacts that are physically coupled to power supply contacts of the server components when they inserted into one of the rack's slots. The power distribution strip 312 includes a connector 314 that can be physically coupled to a mating connector, forming part of an AC power distribution infrastructure, residing in or on the back wall of the infrastructure framework forming the bay in which it is to be installed and housed.

The back of the rack assembly 300 can also include a data I/O strip 316 that provides contacts to I/O contacts on the server components. These contacts are also physically coupled to one another when the server components are slotted into the rack assembly. Data I/O strip 316 can also include a connector 310 that can be physically coupled to a mating connector, forming part of an data I/O distribution infrastructure, residing in or on the back wall of the infrastructure framework forming the bay in which it is to be installed and housed. The rack assembly can include wheels 136 which facilitate easy positioning and installation of a rack assembly 300 loaded with server components into a bay of the infrastructure framework.

Figure 4:
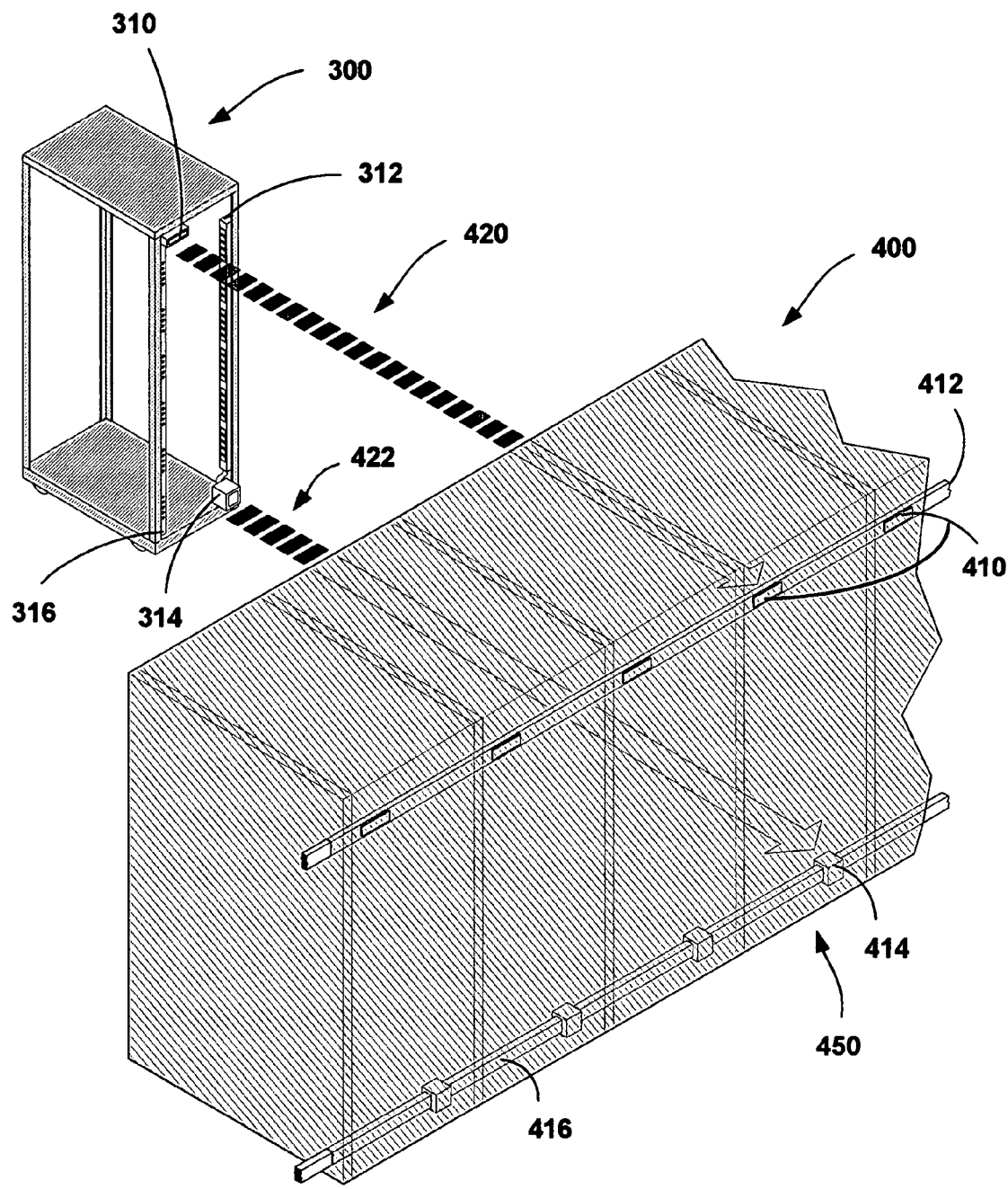
FIG. 4 is a rear perspective view of an infrastructure framework component and the modular rack assembly of FIG. 3 as they cooperate to form part of a modular high density computer system in accordance with an embodiment of the invention.

FIG. 4 is a see-through view from the back of an embodiment of the infrastructure framework 400 of the invention illustrating how an embodiment of the rack assembly 300 can be mated to the AC power 416 and data I/O distribution 412 infrastructures and housed within a bay 450 of the infrastructure framework 400. In an embodiment, a rack assembly 300 that has been loaded with server components can be wheeled into bay 450 of infrastructure framework 400. The mating connectors 314 and 310 of rack assembly 300 can be mated with connectors 414 and 410 respectively of the infrastructure framework along site lines 420 and 422. This facilitates simple and uncluttered provision of AC power and data I/O to the server components populating the rack assembly 300 through AC power and data I/O distribution infrastructure components 416 and 412 respectively of infrastructure framework 400.

It will be appreciated by those of skill in the art that by separating the computational components of a high density computer system from the requisite cooling, power distribution, data I/O distribution, and housing infrastructure components, significant advantages can be achieved by embodiments of the invention over current configurations of such computer systems. The computational components can be assembled and tested for proper operation while the infrastructure components are shipped separately in advance of the computational components. Thus, the infrastructure cooling components, data and power distribution components, and framework components can be delivered, and their time intensive installation completed more easily and prior to receiving the tested computational components. Moreover, the shipping of the computational components separately from the infrastructure components achieves less laborious and less costly delivery and handling of the components. Finally, it makes it easier for the data center to upgrade or add additional infrastructure and infrastructure components to a current installation.

What is claimed is:

1. A modular high-density computer system comprising:
   an infrastructure comprising:
      a framework component forming a plurality of bays;
      one or more cooling components;
   one or more computational components comprising:
      a rack assembly; and
      a plurality of servers installed in the rack assembly;
         wherein the infrastructure further comprises a data I/O distribution component and a connector coupled thereto; and the rack assembly further comprises a data I/O distribution strip coupled to the plurality of servers; and a connector coupled to the data I/O distribution strip for coupling with the connector of the data I/O distribution component when installed in one of the plurality of bays; and
      wherein each of the one or more computational components is assembled and shipped to an installation site separately from the infrastructure and then installed within one of the plurality of bays after the infrastructure is installed at the installation site.

2. The modular high-density computer system of claim 1 wherein:
   the infrastructure further comprises a power distribution component and a connector coupled thereto; and
   the rack assembly further comprises a power distribution strip coupled to the plurality of servers; and
   a connector coupled to the power distribution strip for coupling with the connector of the power distribution component when installed in one of the plurality of bays.

3. The modular high-density computer system of claim 1 wherein at least one of the cooling components is a heat exchange cooling system housed within one of the plurality of bays.

4. A modular high-density computer system comprising:
   an infrastructure comprising:
      a framework component forming a plurality of bays;
      a power distribution component and a connector coupled thereto;
      a data I/O distribution component and a connector coupled thereto; and
      one or more cooling components; and
   one or more rack assemblies comprising:
      a power distribution strip for providing power to a plurality of servers when said servers are installed in said one or more rack assemblies; and a connector coupled to the power distribution strip for coupling with the connector of the power distribution component when said one or more rack assemblies is installed in said plurality of bays; and
      a data I/O distribution strip for coupling data I/O to a plurality of servers when said servers are installed in said one or more rack assemblies; and a connector coupled to the data I/O distribution strip for coupling with the connector of the data I/O distribution component when said one or more rack assemblies is installed in said plurality of bays; and
   wherein each of the one or more rack assemblies is shipped to an installation site separately from the infrastructure and then installed within one of the plurality of bays after the infrastructure is installed at the installation site.

5. The modular high-density computer system of claim 4 further comprising one or more computational components, each of the one or more computational components comprising one of the plurality of rack assemblies and a plurality of servers installed therein.

6. The modular high-density computer system of claim 5 wherein the one or more computational components are tested to be fully operational prior to shipment and installation within one of the plurality of bays.

7. The modular high-density computer system of claim 4 wherein at least one of the cooling components is a heat exchange cooling system housed within one of the plurality of bays.

8. A method of manufacturing a high-density computer system comprising:

assembling an infrastructure comprising:
   a framework component forming a plurality of bays;
   one or more cooling components;
assembling one or more computational components, said assembling further comprising installing a plurality of servers in a rack assembly;
shipping the infrastructure to an installation site separately from and ahead of the one or more computational components;
installing the infrastructure at the installation site;
shipping the one or more computational components to the installation site; and
installing each of the one or more computational components in one of the plurality of bays after the infrastructure is installed at the installation site.

9. The method of manufacturing a high-density computer system of claim 8 wherein said installing the infrastructure further comprises installing a heat exchange cooling system within one or more of the plurality of bays.

10. The method of manufacturing a high-density computer system of claim 8 wherein:
   the assembled infrastructure further comprises a power distribution component and a connector coupled thereto; and
   the rack assembly of the assembled computational components further comprises a power distribution strip coupled to the plurality of servers; and a connector coupled to the power distribution strip for coupling with the connector of the power distribution component when installed in one of the plurality of bays.

11. The method of manufacturing a high-density computer system of claim 8 wherein:
   the assembled infrastructure further comprises a data I/O distribution component and a connector coupled thereto; and
   the rack assembly of the assembled computational components further comprises a data I/O distribution strip coupled to the plurality of servers; and a connector coupled to the data I/O distribution strip for coupling with the connector of the data I/O distribution component when installed in one of the plurality of bays.

12. The method of manufacturing a high-density computer system of claim 8 wherein said assembling one or more computational components further comprises testing the one or more computational components to be fully operational prior to said shipping and said installing of the computational components.

13. The method of manufacturing a high-density computer system of claim 10 wherein said installing each of the one or more computational components in one of the plurality of bays further comprises coupling the connector of the power distribution strip to the connector of the power distribution component.

14. The method of manufacturing a high-density computer system of claim 11 wherein said installing each of the one or more computational components in one of the plurality of bays further comprises coupling the connector of the data I/O distribution strip to the connector of the data I/O component.

* * * * *